(12) United States Patent
Sun

(10) Patent No.: US 6,845,647 B2
(45) Date of Patent: Jan. 25, 2005

(54) HEAT SINK PROCESSING METHOD

(75) Inventor: Chung-Chuen Sun, Ping Zhen (TW)

(73) Assignee: Fan Zhen Co., Ltd., Taoyuan Hsien (TW)

( * ) Notice: Subject to any disclaimer, the term of this patent is extended or adjusted under 35 U.S.C. 154(b) by 103 days.

(21) Appl. No.: 10/229,157

(22) Filed: Aug. 28, 2002

(65) Prior Publication Data

US 2004/0042153 A1 Mar. 4, 2004

(51) Int. Cl.$^7$ .............................................. B21D 28/00
(52) U.S. Cl. ...................................... 72/325; 29/890.05
(58) Field of Search ............... 72/325, 421; 29/890.046, 29/890.05, 727

(56) References Cited

U.S. PATENT DOCUMENTS

| | | | | |
|---|---|---|---|---|
| 3,886,639 A | * | 6/1975 | Pasternak | 72/325 |
| 4,330,913 A | * | 5/1982 | Kritzer | 72/325 |
| 4,332,069 A | * | 6/1982 | Kritzer | 72/325 |
| 4,349,949 A | * | 9/1982 | Kritzer | 72/325 |
| 4,637,111 A | * | 1/1987 | Pasternak et al. | 29/890.05 |
| 4,794,985 A | * | 1/1989 | Paulman et al. | 165/150 |

FOREIGN PATENT DOCUMENTS

GB    2071530    * 9/1981    .................. 72/325

* cited by examiner

Primary Examiner—Daniel C. Crane
(74) Attorney, Agent, or Firm—Troxell Law Office PLLC

(57) ABSTRACT

The heat sink processing method including the steps of: a working machine with a feeding mechanism is provided in a working zone; a power arm of the working machine drives an elastically extending and contracting knife set as well as a stopping and pushing mechanism comprising a fin fixing rod and a pushing edge; a material block is fixed on the feeding mechanism which progresses for a predetermined distance; the material block is cut after an equal moving distance each time and in a bevel way by the elastically extending and contracting knife set; at the time of bevel cutting and progressing, the stopping and pushing mechanism pushes and erects a fin cut last time; the process is performed till cutting of the material block is completed.

6 Claims, 6 Drawing Sheets

HEAT SINK PROCESSING METHOD

BACKGROUND OF THE INVENTION

1. Field of the Invention

The present invention is related to a heat sink processing method, and especially related to a processing method by which a working machine performs manufacturing of the heat sink in cooperating with a knife set progressing in a bevel way and a feeding mechanism; the method suits particularly manufacturing of a heat sink of high efficiency with multiple and concentrated fins or the like.

2. Description of the Prior Art

By virtue that science and technology as well as industries have been highly developed; the rate of inventing of various electric appliances is raised relatively. To these electric appliances, the problem of heat sinking is quite important in maintaining normal operation of the electric appliances; especially by fast progressing of modern computers, working speed of CPU's gets faster and faster from day to day, and high temperature results accordingly, it needs heat sinks of high efficiency with fans for scattering heat, otherwise, the CPU's will be burned.

Speak about a conventional heat sink often seen, it is made by extruding of aluminum; the heat sink made by extruding of aluminum has fins with quite large thickness, and the space between every two fins is unable to be reduced. Thereby, number of fins that can be formed in every unit area is limited, and heat sinking area can not be effectively increased. A single fin has limited heat sinking effect; the only way to increase the heat sinking area is to make the heat sink relatively large, but this does not meet the requirement of the above mentioned CPU's of high speeds.

To eliminate the problem that the volume of a heat sink is large but the heat sinking effect of the heat sink is not good, a new fashioned heat sink has been made by using an automation CNC working machine. Such a working machine has a knife set fixed and has the fed material pushed forwards in sequence; the material block is cut in a bevel way to get fins, the thickness of cutting each time is very small, this can improve the space between every two fins to largely reduce the volume of the heat sink; however, the working machine is expensive at a price of about 4,000 thousands New Taiwan Dollar, while its speed of manufacturing is slow, this is the primary defect thereof.

SUMMARY OF THE INVENTION

The primary object of the present invention is to provide a heat sink processing method, by which method it is especially most suitable to use a conventional working machine as a punch press in cooperating with a knife set progressing in a bevel way and a feeding mechanism, the method can not only fast manufacture a heat sink of high efficiency, but also can manufacture with lower cost that is only ⅕ of a CNC.

To get the object, the present invention mainly is provided in the working zone of the working machine with a feeding mechanism; a power arm of the working machine drives an elastically extending and contracting knife set as well as a stopping and pushing mechanism, a material block is fixed on the feeding mechanism which progresses for a predetermined distance. When in simultaneous progressing and cutting, by stopping of the stopping and pushing mechanism, formerly cut fins can be pushed to be erected one by one till the entire material block is completely cut.

The present invention will be apparent after reading the detailed description of the preferred embodiments thereof in reference to the accompanying drawings.

DETAILED DESCRIPTION OF THE PREFERRED EMBODIMENT

Figure 1:
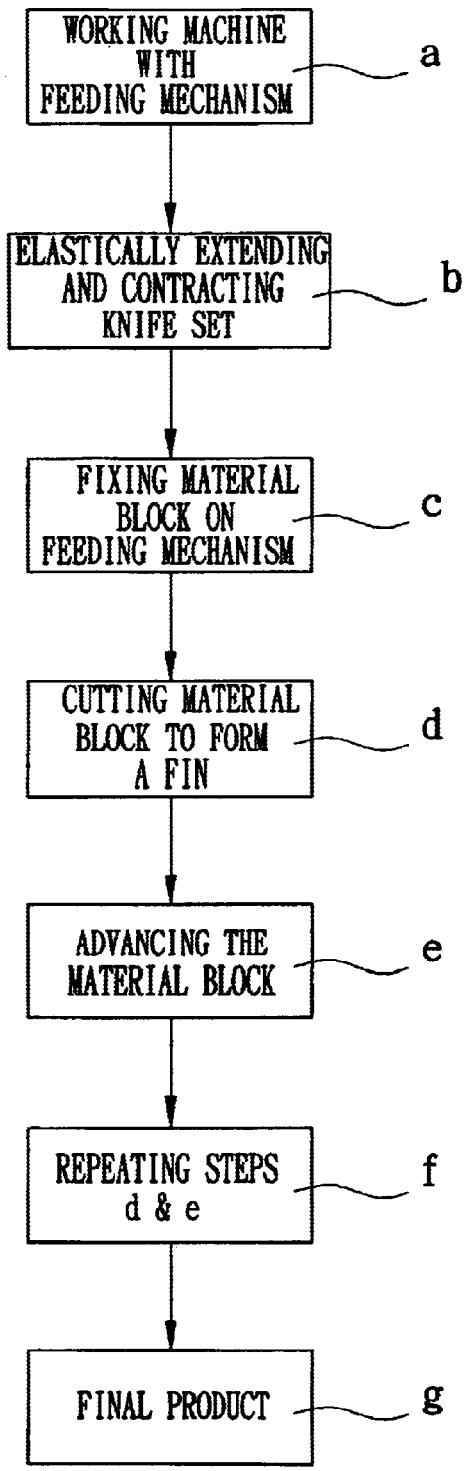
FIG. 1 shows the steps of the present invention.
Figure 2:
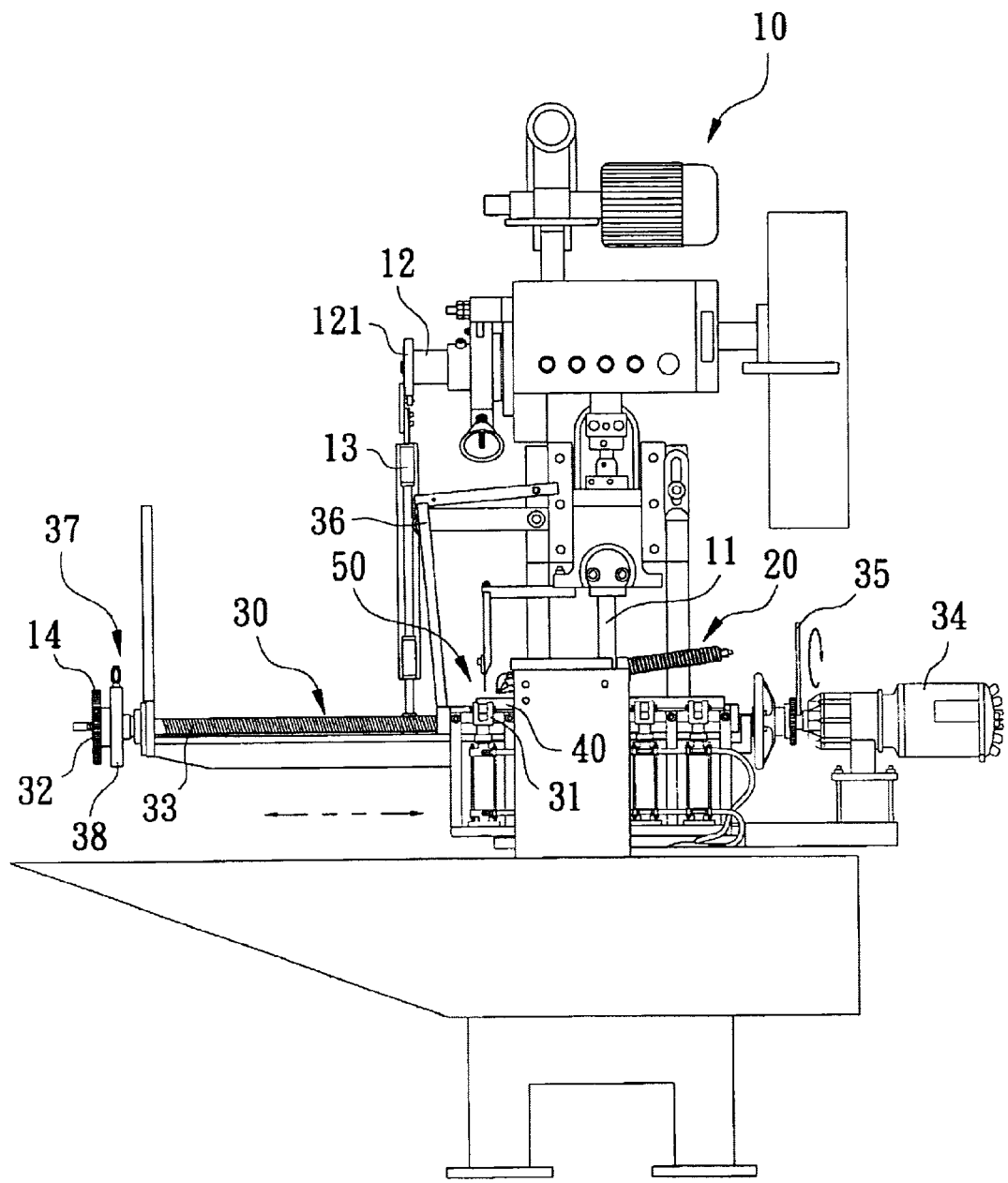
FIG. 2 is a plane view showing the complete appearance of the present invention.
Figure 3:
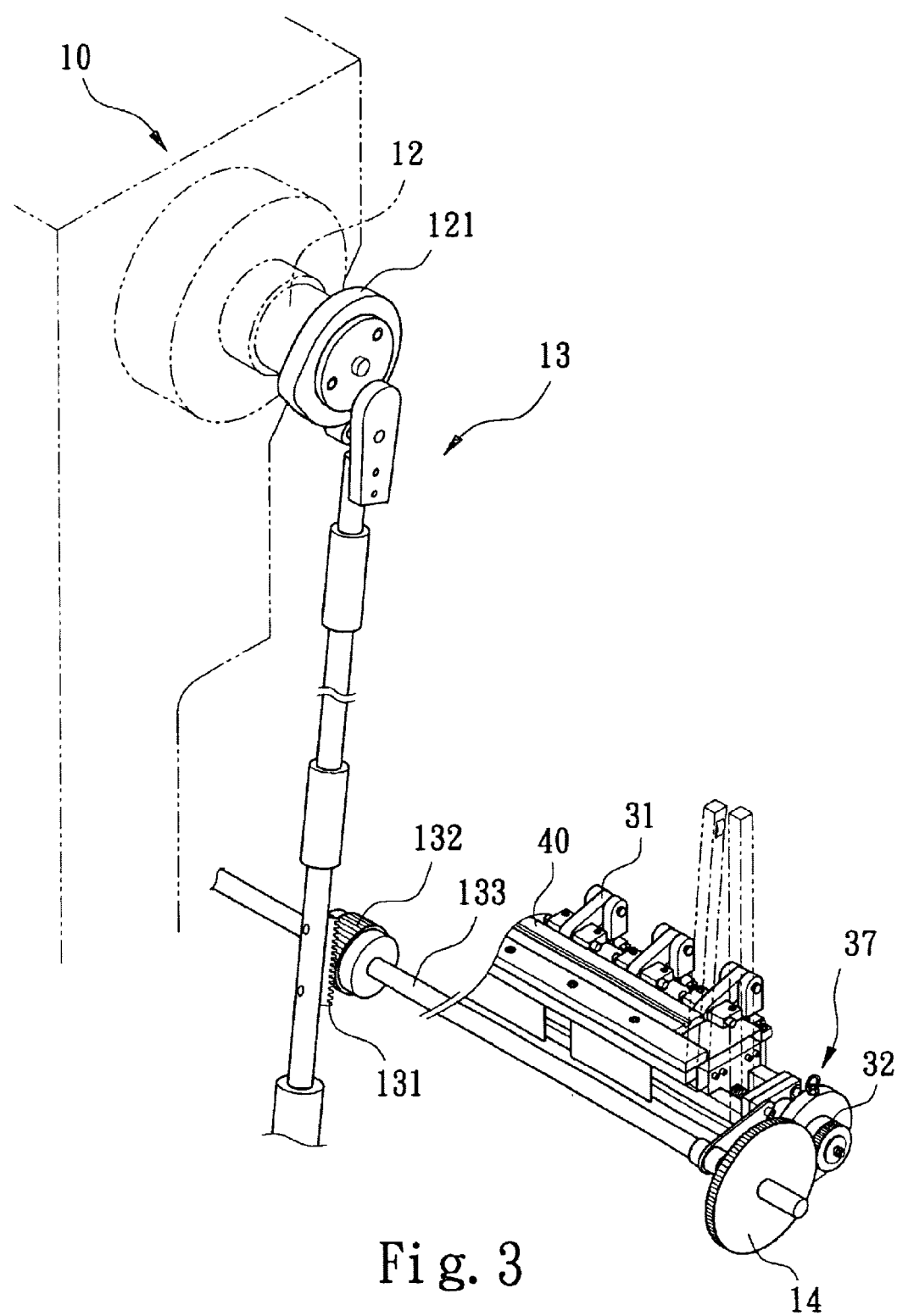
FIG. 3 is a perspective view showing allocation of the feeding mechanism of the present invention.
Figure 4:
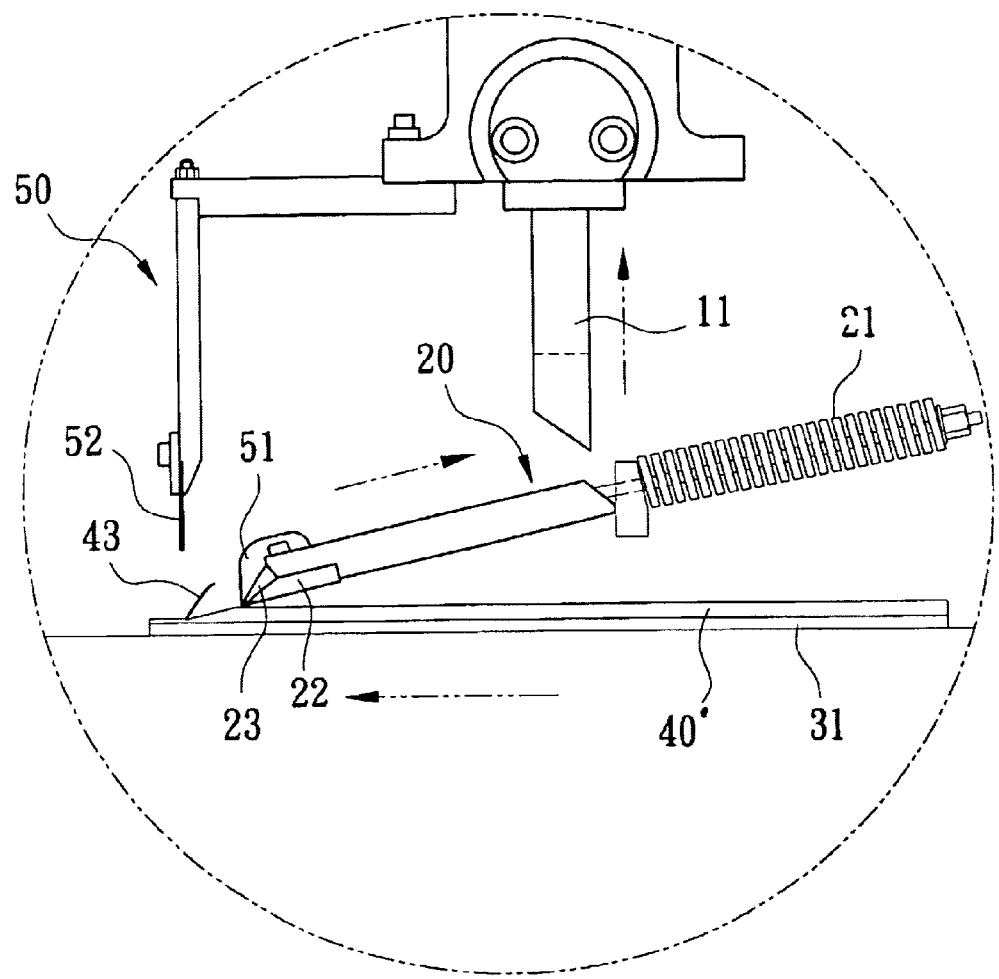
FIGS. 4–5 are schematic views showing operation of the present invention.
Figure 5:
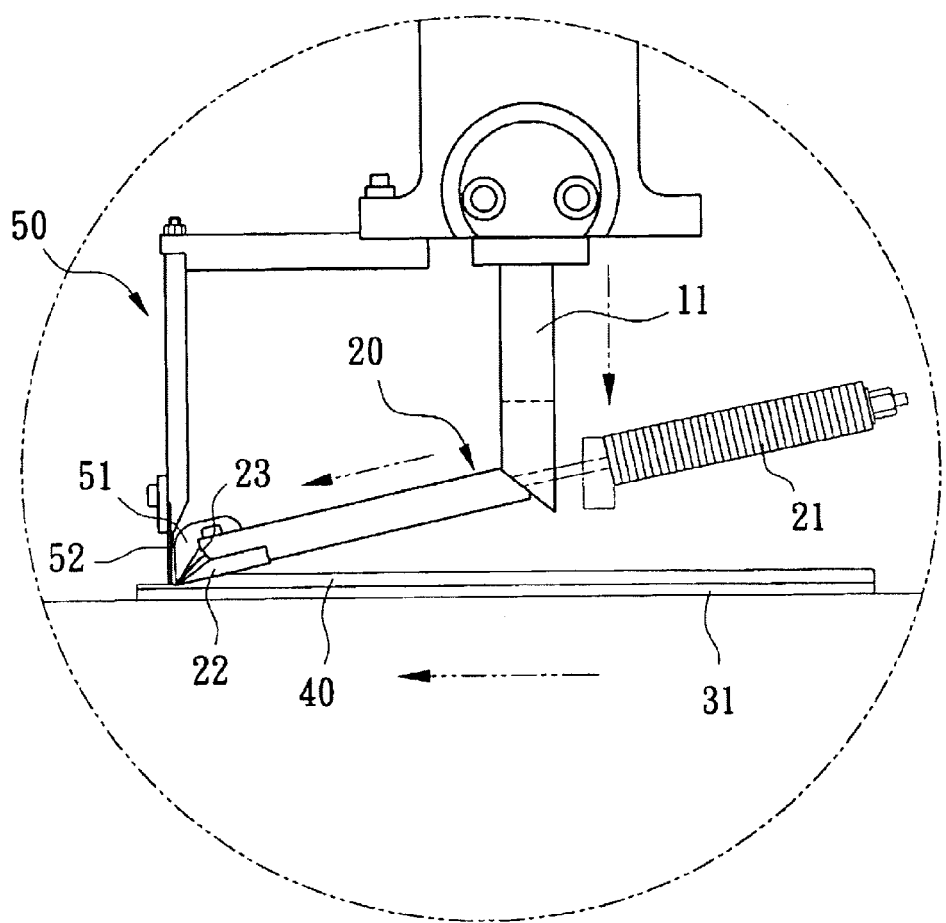

Referring to FIGS. 1–6, the present invention includes the steps of:

a. a working machine with a feeding mechanism 30 is provided in the working zone;

b. a power arm of the working machine drives an elastically extending and contracting knife set 20 as well as a stopping and pushing mechanism 50 comprising a fin fixing rod 52 and a pushing edge 51;

c. a material block 40 is fixed on the feeding mechanism 30 which progresses for a predetermined distance;

d. the material block 40 is cut after an equal moving distance each time and in a bevel way by the elastically extending and contracting knife set 20;

e. at the time of bevel cutting and progressing, the stopping and pushing mechanism 50 pushes and erects a fin cut last time; and f. the steps d. and e. are repeated to cut the material block 40 to get and erect a lot of fins 43 which are thin, the fins 43 are concentrated, thereby the heat sinking area of the fins 43 can be effectively increased.

By the above stated steps, a conventional working machine can be changed to manufacture a heat sink of high efficiency with lower cost of equipment.

When in practicing, the working machine can be a punch press 10 or an automation CNC. Taking the punch press 10 as an example, the equipment completed after changing of the working machine in cooperating with a knife set 20 progressing in a bevel way and a feeding mechanism 30 is shown as in FIG. 2, the feeding mechanism 30 is generally in a rectangular shape and is allocated at a lower position, a power arm punch 11 of the punch press 10 is set in a bevel mode, the bevel punch 11 is provided on the bottom thereof with the knife set 20 progressing in a bevel way, which knife set 20 acts synchronically with the stopping and pushing mechanism 50.

That is to say, when the bevel punch 11 is moved, it can simultaneously move an "L" shaped fin fixing rod 52 of the stopping and pushing mechanism 50; the pushing edge 51 of the stopping and pushing mechanism 50 is provided on the upper surface of the knife set 20 progressing in a bevel way, the knife set 20 is provided on the end thereof with a knife 22 of which the bottom on the front end thereof has a recess 23. By providing the recess 23, the knife 22 can be distinguished; the pushing edge 51 of the stopping and pushing mechanism 50 looks like an upper beak of a bird, and can provide a pushing action when in cutting.

The interspaces in feeding material for the entire feeding mechanism 30 is determined by providing a dial on a cam 121 provided on a follower axle 12 on the power arm of the working machine and by rotation moving a bolt 33 for a fixed distance to its predetermined position by having mechanically linking-up differential to allow a positioning rod 37 to hold the bolt 33 in position.

Particularly, the follower axle 12 on the punch press 10 is provided with a cam 121 to move a linked-up rod 13 which is provided at a suitable position on the bottom thereof with a gear rack 131 for engaging a linked-up gear 132, a rod 133 serially connected with the linked-up gear 132 rotates a reducing gear 14 provided on the front end thereof, the reducing gear 14 engages with a transmission gear 32 to get the differential to transmit the serially connected bolt 33, and the positioning rod 37 fixes the bolt 33 when the latter progresses to a predetermined position, the other end of the bolt 33 is combined with a motor 34. The motor 34 is provided thereon with a retroverting switch 35, and the bolt 33 is further provided thereon with a clamping seat 31 for clamping the material block 40, and the clamping seat 31 is provided on the end thereof with a contact switch 36.

Referring FIGS. 2–5, the material block 40 is placed on the clamping seat 31 in the first place, and is generally provided centrally thereof with a separating groove 42 and on the lateral sides thereof with flanges 41 for convenience of clamping of the clamping seat 31. The retroverting switch 35 is activated after fixed clamping; thereby the motor 34 is activated to make sliding of the clamping seat 31 together with the material block 40 toward the starting position (namely a position under the knife 22). At this time, the punch press 10 is activated to make the punch 11 move to and fro; when the punch 11 with a bevel end rushes down onto the knife set 20 to push forwards the latter, the knife 22 on the end of the knife set 20 thereby cuts in a bevel way; when the punch 11 restores to its raised position and the force of down pressing disappears, the knife 22 on the end of the knife set 20 restores to its original position by a spring 21 provided on the other end.

In operation, when the cam 121 provided on a follower axle 12 with the function of a dial is rotated, it pushes the linked-up rod 13 on which the gear rack 131 moves the linked-up gear 132; the linked-up gear 132 moves the reducing gear 14 through the rod 133 to in turn rotates the transmission gear 32 engaged therewith; the bolt 33 serially connected to the transmission gear 32 is rotated simultaneously, so that the clamping seat 31 thereon is moved for a distance to move forwards the material block 40 placed on the clamping seat 31 (i.e., to move forwards the area where the knife 22 is to cut in a bevel way); then the bolt 33 is fixed by the positioning rod 37.

When the bevel punch 11 once more rushes down to push forwards the knife 22 to thereby cuts out a second fin 43 from the material block 40, the fin fixing rod 52 of the stopping and pushing mechanism 50 is pressed down following the bevel punch 11 to abut the root portion of the second fin 43 cut out in a bevel way and being at the front end of the material block 40, and the second fin 43 simultaneously is pushed to fold up by the pushing edge 51.

The sequential actions of material feeding, rushing down, cut in a bevel way, abutting and knife retracting can be completed within a stroke (i.e., the cam 121 runs for a circle), when the cam 121 rotates for 0–90°, the linked-up rod 13 moves forward the clamping seat 31 of the feeding mechanism 30 to move forwards the material block 40 to the position for cutting. And after positioning with the positioning rod 37, the bevel punch 11 is lowered. When the cam 121 rotates for 90–180°, the linked-up rod 13 is not moved, the punch 11 is lowered to contact the knife set 20, the knife 22 on the end of the knife set 20 starts to move forwards to cut in a bevel way. When the cam 121 rotates for 180–270°, the linked-up rod 13 is not moved, the punch 11 is retracted, and the knife set 20 is retracted too. When the cam 121 rotates for 270–360°, the linked-up rod 13 is moved back to its original position, the positioning rod 37 is removed from a dial 38, so that the punch 11 totally gets rid of the knife set 20 progressing in a bevel way and restores to its original position.

The process is repeatedly progressed till the entire material block 40 is completely cut. The contact switch 36 provided on the end of the clamping seat 31 is contacted to stop the operation of the machine. And when in stopping the operation of the machine, the totally cut material block 40 is taken out, and another material block 40 is placed on the clamping seat 31 and is firmly clamped, the retroverting switch 35 is activated again to activate the motor 34 to make sliding of the clamping seat 31 together with the material block 40 toward the starting position (namely the position under the knife 22). At this time, the punch press 10 is activated to repeat the above actions. By cooperation of the punch press 10 with the knife set 20 progressing in a bevel way and the feeding mechanism 30, not only the cost of production can be largely reduced, but also the speed of production can be increased.

Figure 6:
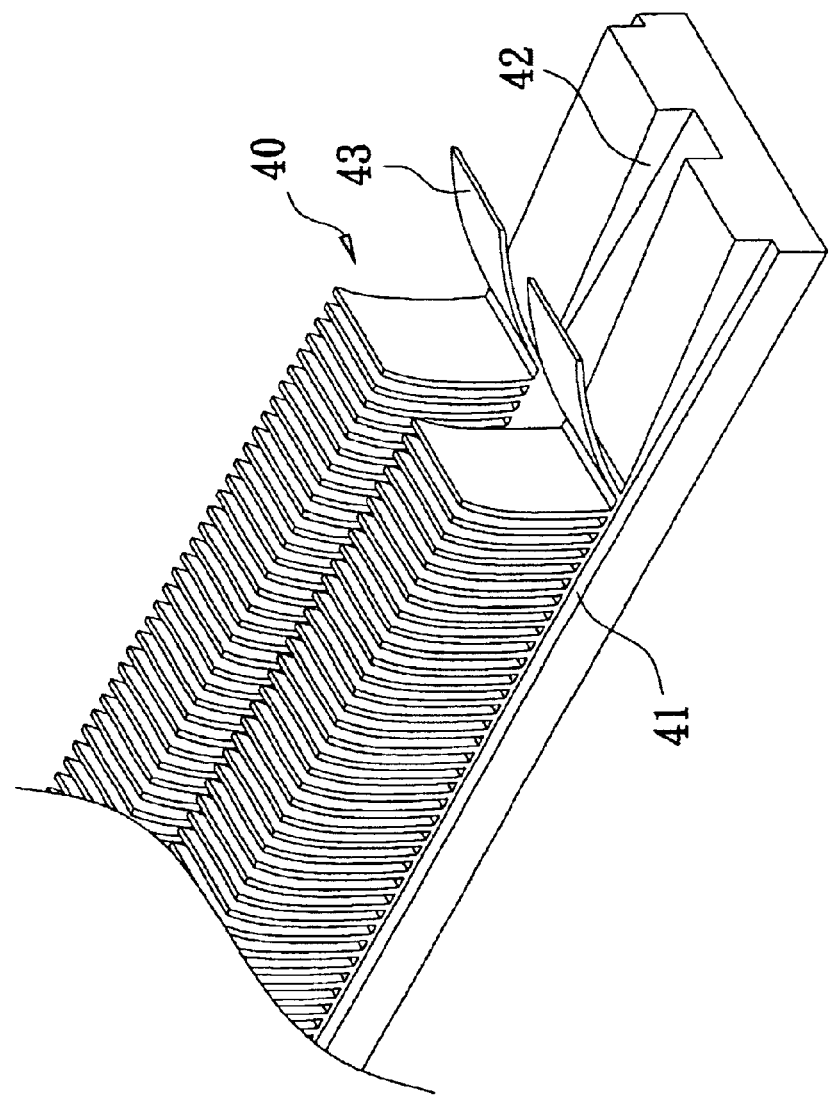
FIG. 6 is a schematic view showing a heat sink completed by the present invention.

The material block 40 in completion of cutting and folding will be in the state as shown in FIG. 6, a lot of fins 43 capable of increasing the surface area thereof can be formed thereon. Therefore, after completion of cutting and folding, the material block 40 as a whole forms a heat sink of large volume; the method completely cuts the material block 40 only depending on the volume and length required, it can make an integral heat sink with multiple and concentrated thin fins having increased surface area for heat sinking.

The present invention is a complete set of assembly to be attached to a working machine, its scope of use can be larger; in addition to be used on a punch press 10, it can also be mounted on a CNC working machine in practice, and can similarly save cost and increase the speed of production.

In view of the above statement, the present invention is advantageous in that:

1. A heat sink with an increased surface area for heat sinking can be made just by using a punch press in cooperating with a knife set progressing in a bevel way and a feeding mechanism, each set of equipment only costs 800 thousands New Taiwan Dollar; this largely saves the cost for purchasing producing machines of high unit price, thereby, an effect of largely lowering the cost of production can be obtained.

2. The method of the present invention can reduce the space between every two fins, and can increase the volume of the heat sink within a predetermined distance; thereby, the defect of inability of reducing the volume of a heat sink produced by extruding of aluminum can be effectively eliminated.

3. The method using a punch press of lower cost in cooperating with a knife set progressing in a bevel way and a feeding mechanism can complete the sequential actions of material feeding, rushing down, cut in a bevel way, abutting and knife retracting within a single stroke, it is about 1.2 folds faster than the production with an expensive CNC, thereby can increase the speed of production of the heat sink in a more economic and effective way.

In conclusion, the brand-new heat sink processing method disclosed in the present invention is novel and is competitive in the markets, thereby it is industrial valuable. Having thus described my invention, what I claim as new and desire to be secured by Letters Patent of the United States are:

What is claimed is:

1. A heat sink processing method including the steps of:
   a) providing a working machine with a feeding mechanism in a working zone;
   b) driving an elastically extending and contracting knife set and a stopping and pushing mechanism having a fin fixing rod and a pushing edge utilizing a power arm of the working machine;
   c) fixing a material block on said feeding mechanism which progresses a predetermined distance;
   d) cutting said material block to create a fin utilizing the elastically extending and contracting knife set;
   e) advancing the material block a predetermined distance utilizing the stopping and pushing mechanism; and
   f) repeating the cutting step d) and the advancing step e) a predetermined number of times to produce a plurality of fins in a heat sinking area, wherein in the advancing step e) interspaces in the feeding material are determined by a dial provided on a follower axle on a power arm of said working machine and by rotating a bolt of the feeding mechanism a fixed distance to a predetermined position by utilizing a mechanically linked-up differential.

2. The method according to claim 1, wherein in the providing step a) the working machine is an automation CNC.

3. The method according to claim 1, wherein in the providing step a) the working machine is a punch press and the cutting step d) and the advancing step e) are completed within a stroke.

4. The method according to claim 1, wherein said fins are pushed to erect by lowering and abutment of an "L" shaped fin fixing rod moving together with said power arm and by pushing of a pushing edge of said stopping and pushing mechanism looking like an upper beak of a bird provided on the upper surface of said knife set progressing in a bevel way.

5. The method according to claim 1, wherein in the advancing step e) said interspaces in the feeding material are further determined by providing a cam on said follower axle to move a linked-up rod which is provided on a bottom thereof with a gear rack for engaging a linked-up gear, a rod serially connected with the linked-up gear rotates a reducing gear provided on a front end thereof, said reducing gear engages with a transmission gear such that the mechanically linking-up differential rotates the bolt.

6. The method according to claim 5, wherein in the cutting step d) and the advancing step e), when the cam rotates from 0° to 90°, the linked-up rod moves toward the material block of said feeding mechanism to a position for cutting, and a punch is lowered; when said cam rotates from 90° to 180°, said linked-up rod is not moved, said punch is lowered to contact said knife set, said knife moves forward to cut in a bevel way; when said cam rotates from 180° to 270°, said linked-up rod is not moved, said punch is retracted, and said knife set is retracted; when said cam rotates from 270° to 360°, said linked-up rod moves back to an original position, said positioning rod is removed from the dial, such that said punch totally moves said knife set to an original position.

* * * * *